(12) United States Patent
Abdo et al.

(10) Patent No.: US 9,904,757 B2
(45) Date of Patent: Feb. 27, 2018

(54) TEST PATTERNS FOR DETERMINING SIZING AND SPACING OF SUB-RESOLUTION ASSIST FEATURES (SRAFS)

(71) Applicant: GLOBALFOUNDRIES INC., Grand Cayman (KY)

(72) Inventors: Amr Y. Abdo, Wappingers Falls, NY (US); Ioana Graur, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 139 days.

(21) Appl. No.: 14/985,686

(22) Filed: Dec. 31, 2015

(65) Prior Publication Data

US 2017/0193150 A1    Jul. 6, 2017

(51) Int. Cl.
*G06F 17/50*   (2006.01)

(52) U.S. Cl.
CPC ................. *G06F 17/5081* (2013.01)

(58) Field of Classification Search
USPC .......................................... 716/51
See application file for complete search history.

(56) References Cited

U.S. PATENT DOCUMENTS

| | | | |
|---|---|---|---|
| 6,602,728 B1 | 8/2003 | Liebmann et al. | |
| 6,709,793 B1 | 3/2004 | Brankner et al. | |
| 7,001,693 B2 | 2/2006 | Liebmann et al. | |
| 7,648,803 B2 | 1/2010 | Sivakumar et al. | |
| 7,995,199 B2 | 8/2011 | Hess et al. | |
| 2006/0200790 A1 | 9/2006 | Shang et al. | |
| 2007/0224519 A1* | 9/2007 | Sivakumar | G03F 1/36 430/5 |
| 2014/0317580 A1* | 10/2014 | Ye | G03F 1/144 716/53 |
| 2015/0213161 A1 | 7/2015 | Meiring et al. | |

* cited by examiner

*Primary Examiner* — Bryce Aisaka
(74) *Attorney, Agent, or Firm* — Gibb & Riley, LLC; Yuanmin Cai, Esq.

(57) ABSTRACT

A processor receives an integrated circuit design, divides the integrated circuit design into a test portion and a remaining portion, and adds sub-resolution assist features (SRAFs) having different size and spacing parameters to the test portion of the integrated circuit design to generate a single test pattern. Exposure and development equipment performs a single exposure and development process of the single test pattern to produce a single test photoresist. The processor analyzes the single test photoresist to determine which of the size and spacing parameters are unacceptable and which are acceptable, based on differences between the single test photoresist and a model photoresist that the test portion of the integrated circuit design without the SRAFs would produce. The processor adds SRAFs having the acceptable size and spacing parameters to the remaining portion of the integrated circuit design.

20 Claims, 5 Drawing Sheets

TEST PATTERNS FOR DETERMINING SIZING AND SPACING OF SUB-RESOLUTION ASSIST FEATURES (SRAFS)

BACKGROUND

The present disclosure relates to integrated circuit design and manufacturing, and more particularly, to sizing and spacing of sub-resolution assist features (SRAFs) added to integrated circuit designs in photolithographic processing.

Sub-resolution assist features (SRAFs) are added to integrated circuit designs to allow lithographically formed structures to be smaller and sharper than the minimum resolution of an exposure system would otherwise allow. Images printed on a photoresist for an isolated lithographic pattern are more sensitive to focus variations than images for a dense lithographic pattern, and such SRAFs are commonly added to main shapes in a photolithographic mask to create a denser environment for robust printing of integrated circuit features. The SRAFs are not intended to be reproduced as distinct features in the photoresist (e.g., they should not print in the photoresist) because SRAFs only perform the function of increasing the focus sharpness of the main shapes of the integrated circuit features that are printed in the photoresist. Therefore, SRAFs can increase the depth of focus or process window, but SRAFs should avoid being formed as separate structures because such structures could transfer to subsequent steps of the chip manufacturing process and cause unintended consequences.

Such integrated circuit designs that include SRAF features are modeled (tested using either a computer simulator, or by being subjected to a portion of a full manufacturing process, such as test patterning layers through different test exposure masks) before actually being manufactured, to allow any design defects to be detected and corrected prior to expending resources manufacturing potentially defective integrated circuit designs. Such test masks that include SRAF features are sometimes referred to as SRAF macros, and it is common to test how the different SRAF configuration affect a given integrated circuit design differently, using tens or hundreds of different SRAF configurations (e.g., different SRAF sizes and spacing). Each one of the different SRAF configuration on the macro utilizes SRAFs having a single and uniform shape, size, and spacing, such that each SRAF test case has SRAFs that are shaped, sized, and/or spaced differently from the other SRAF test case that are applied to the given integrated circuit design. The SRAF test case that produces the sharpest focus, without having the SRAFs print in the photoresist, identifies the best SRAF shape, size, and spacing for the given integrated circuit design. However, such processes require designers to make and expose many different SRAF test cases, and to evaluate many different resulting exposed photoresists.

A SRAF model is the numerical model that feeds the result of a previous exercise with different SRAF test cases, based on which the model will predict what SRAF configuration will print and what will not print. When building SRAF models, it is common to use images that show transition from non-SRAF printing to SRAF printing. Therefore, a large amount of time is spent designing the SRAF model calibration macro (e.g., the different SRAF test cases) and successful testing is not always guaranteed, because many parameters need to be accounted for with the different test case (SRAFs by themselves only, SRAFs combined integrated circuit features, SRAFs affecting one another, etc.). These parameters can include items such as SRAF size, SRAF to integrated circuit main feature size, SRAF to SRAF size. An exemplary factor that prevents such proper "transition printing" when performing SRAF model building, is that the lithographic development process may not be complete, which can prevent design structure information that accurately captures the transition zone from being known at the time of test mask including the different test case is built. Additional failures in transition printing can occur when engineers attempt to capture too many structures at transition printing zone.

SUMMARY

Various methods herein receive an integrated circuit design, divide the integrated circuit design into a test portion and a remaining portion, and add sub-resolution assist features (SRAFs) having different size and spacing parameters to the test portion of the integrated circuit design to generate a single test pattern.

The SRAFs are positioned between features of the integrated circuit design, and the SRAFs influence and modify how features of the integrated circuit design are printed in the single test photoresist. Features of the integrated circuit design within the test portion have consistent size and spacing parameters in regions where the SRAFs have inconsistent size and spacing parameters. Also, the size and spacing parameters of the SRAFs include SRAF size, SRAF to integrated circuit feature size and spacing, and SRAF to SRAF spacing.

Such methods perform a single exposure and development process of the single test pattern to produce a single test photoresist, and analyze the single test photoresist to determine which of the size and spacing parameters are unacceptable size and spacing parameters, and which of the size and spacing parameters are acceptable size and spacing parameters, based on differences between the single test photoresist and a model photoresist that the test portion of the integrated circuit design without the SRAFs would produce. More specifically, unacceptable size and spacing parameters cause the SRAFs to print within the single test photoresist, and the acceptable size and spacing parameters do not cause the SRAFs to print within the single test photoresist.

Thus, the analysis of the single test photoresist determines how different ones of the SRAFs affect the test portion of the integrated circuit design. Later, such methods can add SRAFs that have the acceptable size and spacing parameters to the integrated circuit design to produce a production photoresist.

Various systems herein include (among other components) a processor that receives an integrated circuit design, divides the integrated circuit design into a test portion and a remaining portion, and adds sub-resolution assist features (SRAFs) having different size and spacing parameters to the test portion of the integrated circuit design to generate a single test pattern.

The SRAFs are positioned between features of the integrated circuit design, and the SRAFs influence and modify how features of the integrated circuit design are printed in the single test photoresist. Features of the integrated circuit design within the test portion have consistent size and spacing parameters in regions where the SRAFs have inconsistent size and spacing parameters. Also, the size and spacing parameters of the SRAFs include SRAF size, SRAF to integrated circuit feature size and spacing, and SRAF to SRAF spacing.

Such systems also include exposure and development equipment operatively (meaning directly or indirectly) connected to the processor. The exposure and development equipment perform a single exposure and development process of the single test pattern to produce a single test photoresist. The processor analyzes the single test photoresist to determine which of the size and spacing parameters are unacceptable size and spacing parameters, and which of the size and spacing parameters are acceptable size and spacing parameters based on differences between the single test photoresist and a model photoresist that the test portion of the integrated circuit design without the SRAFs would produce. The processor adds SRAFs having the acceptable size and spacing parameters to the integrated circuit design to produce a production photoresist.

More specifically, the processor analyzes the single test photoresist by determining how different ones of the SRAFs affected the test portion of the integrated circuit design. The unacceptable size and spacing parameters cause the SRAFs to print within the single test photoresist, and the acceptable size and spacing parameters do not cause the SRAFs to print within the single test photoresist.

Various devices herein include a SRAF test case that includes (among other features) integrated circuit design features within a test portion of an integrated circuit design. The integrated circuit design also includes a remaining portion in addition to the test portion. Further, the SRAF test case includes sub-resolution assist features (SRAFs) having different size and spacing parameters within the test portion of the integrated circuit design.

The SRAFs are positioned between features of the integrated circuit design, and the SRAFs influence and modify how features of the integrated circuit design are printed in the single test photoresist. Features of the integrated circuit design within the test portion have consistent size and spacing parameters in regions where the SRAFs have inconsistent size and spacing parameters. Also, the size and spacing parameters of the SRAFs include SRAF size, SRAF to integrated circuit feature size and spacing, and SRAF to SRAF spacing.

A single exposure and development process of the single test pattern produces a single test photoresist. Analysis of the single test photoresist determines which of the size and spacing parameters are unacceptable size and spacing parameters, and which of the size and spacing parameters are acceptable size and spacing parameters based on differences between the single test photoresist and a model photoresist that the test portion of the integrated circuit design without the SRAFs would produce.

The analysis of the single test photoresist determines how different ones of the SRAFs affected the test portion of the integrated circuit design. The unacceptable size and spacing parameters cause the SRAFs to print within the single test photoresist, and the acceptable size and spacing parameters do not cause the SRAFs to print within the single test photoresist.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
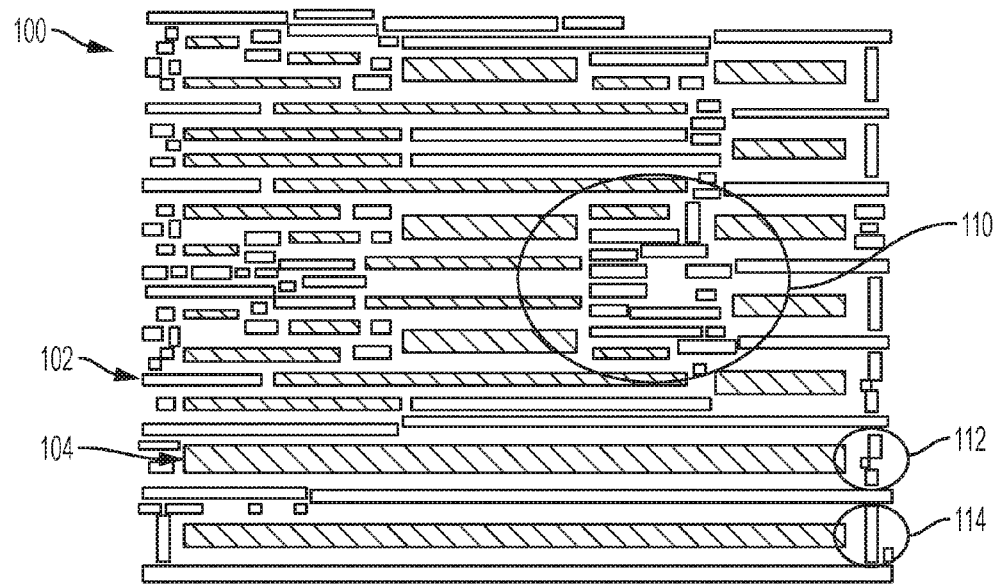
FIG. 1 is a schematic diagram illustrating an exemplary SRAF test case herein.

As mentioned above, it is common to test how the different sub-resolution assist feature (SRAF) configuration (number, size, spacing) affect a given integrated circuit design differently, to calibrate a SRAF model to be used to guide the SRAF placement process, using tens or hundreds of different SRAF test case patterns (e.g., different SRAF configuration). Each different SRAF test case utilizes SRAFs having a single and uniform shape, size, and spacing, such that each SRAF test case has SRAFs that are shaped, sized, and/or spaced differently from the other SRAF test cases that are applied to the given integrated circuit design. The SRAF test case that produces the sharpest focus, without having the SRAFs print in the photoresist, identifies the best SRAF shape, size, and spacing for the given integrated circuit design. However, such processes require designers to make and expose many different SRAF test cases, and to evaluate many different resulting exposed photoresists.

Therefore, SRAFs should be as large as possible to give us the most benefit, without being large enough to actually print. As noted above, sizing of the SRAFs for specific design features is done with a numerical model that is called an SRAF model. The SRAF model is "trained" to know what SRAF size will print and what size will not print. To train the SRAF model different SRAF configuration (test cases) that contain different sizes, spacing, number, are evaluated. Such test cases should have SRAFs that print and SRAFs that do not print to be useful. All these requirements for the SRAF test patterns make building such SRAF models hard to achieve, and many different SRAF patterns are typically evaluated, which consumes too much effort and metrology, without a guarantee of success. In view of this, the systems, devices, and methods herein provide a way to produce this SRAF test pattern that is easier, conserves recourses and engineering time, and very usefully, is guaranteed to work. The systems, devices, and methods herein allow designers to invest the time to design a comprehensive pattern that satisfies all the requirements for success, and in the end, the measurement time and analyses effort is highly decreased, with a much higher success probability.

Thus, numerous issues can arise during testing of a sub-resolution assist features (SRAF) model. For example, a large amount of time is spent designing the SRAF model calibration macro (e.g., the different test masks that are used to test the SRAF) and successful testing is not always guaranteed, because many parameters need to be accounted for with the different test masks (SRAFs by themselves only, SRAFs combined integrated circuit features, SRAFs affecting one another, etc.). In view of these issues, systems and methods herein provide a single test mask pattern for SRAF model calibration.

Instead of using many different test masks, each with its own SRAF parameters, where each different test mask relates to a single SRAF parameter, the systems and methods herein use a single test mask pattern that includes such different SRAF parameters (such as different SRAF sizes and spaces, from both integrated circuit features and from other SRAF structures). This single test mask pattern can be exposed on a wafer image, which cuts the data collection time, and makes sure that the transition printing zone is captured. This single test mask pattern includes both SRAFs that print, and those that do not print.

Therefore, systems and methods herein combine many SRAF parameters into a single test mask pattern that only requires one image capture from metrology. The metrology time saving is highly useful, as the tool used for research and development is the same tool used for production, so savings in research and development tool time, allows higher production and has a direct and effective economic benefit. Using a single test mask pattern to calibrate and verify a SRAF model cuts down the metrology data collection time, especially compared to the tens or hundreds of test mask patterns used conventionally (when multiple test mask patterns are applied to a SRAF model). This single test mask pattern provides a simpler structure design, requires less space, requires a simpler calibration, and produces higher success rates because the single test mask pattern has a higher chance of capturing the print transition zone, which leads to better SRAF models.

Figure 2:
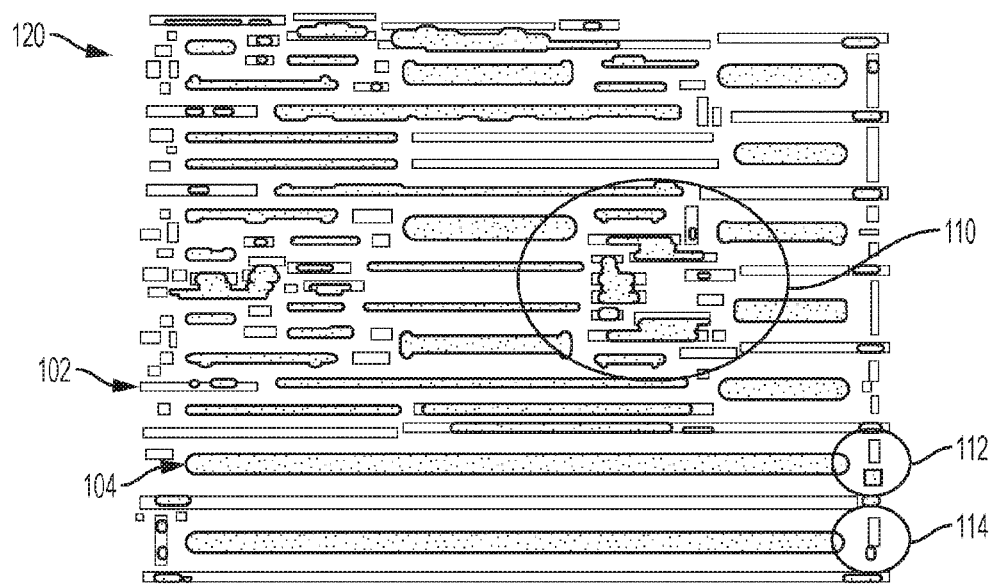
FIG. 2 is a schematic diagram illustrating an exemplary patterned photoresist produced by the SRAF test cases shown in FIG. 2.
Figure 3:
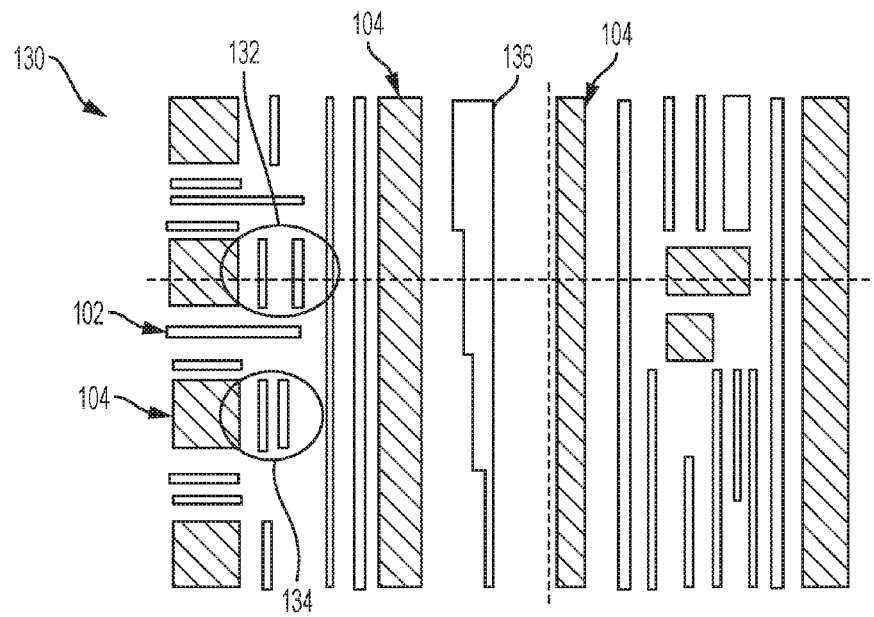
FIG. 3 is a schematic diagram illustrating an exemplary SRAF test case herein.
Figures 4, 5:
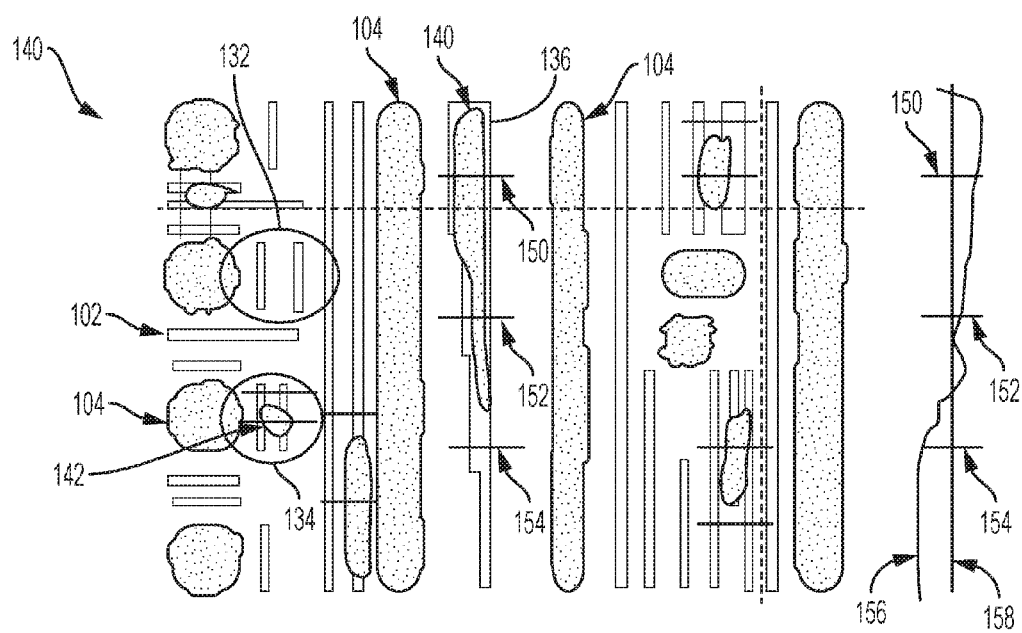
FIG. 4 is a schematic diagram illustrating an exemplary patterned photoresist produced by the SRAF test cases shown in FIG. 3.
FIG. 5 is a graph showing results produced herein.
Figure 6:
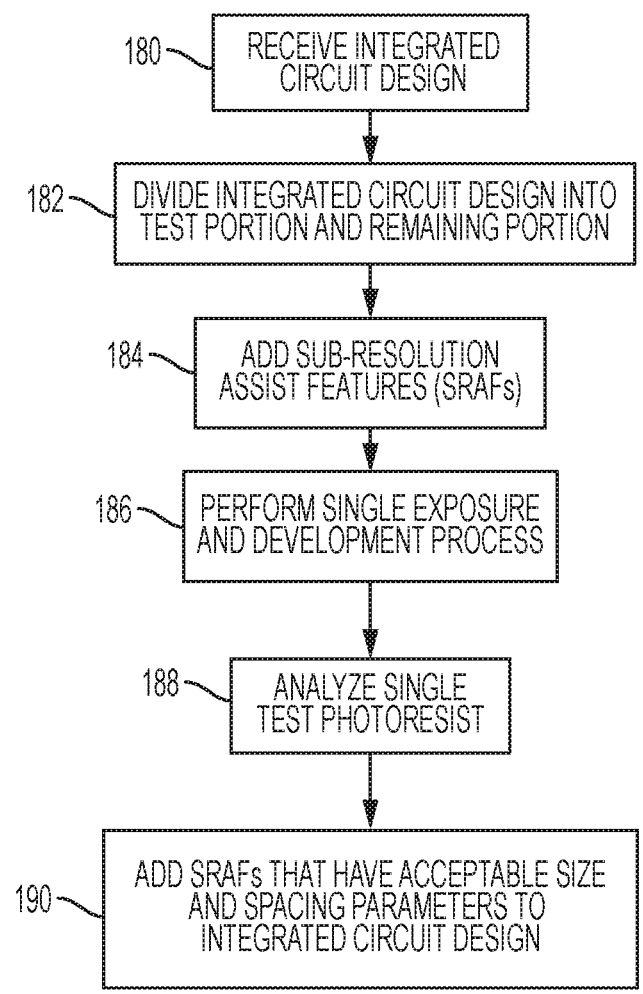
FIG. 6 is a flowchart illustrating the processing performed by various methods herein.

FIGS. 1 and 3 illustrate various exemplary SRAF test cases herein. FIGS. 2 and 4 illustrate various exemplary patterned photoresists produced respectively by the SRAF test cases shown in FIGS. 1 and 3. FIG. 5 is a graph showing results produced herein, and FIG. 6 is a flowchart illustrating the processing performed by various methods herein. More specifically, as shown in item 180 in FIG. 6, various methods herein receive an integrated circuit design in item 180, divide the integrated circuit design into a test portion and a remaining portion in item 182. FIGS. 1 and 3 illustrate two different test portions 100, 130 of one or more integrated circuit designs.

FIGS. 1-4 and 6 also illustrate (in item 184) that such processing adds sub-resolution assist features (SRAFs) 102 having different size and spacing parameters to the test portion of the integrated circuit design 100, 130 to generate a single test pattern. As shown in FIGS. 1 and 3, the SRAFs 102 are positioned between features of the integrated circuit design 104. More specifically, in FIGS. 1 and 3, the features of the integrated circuit design 104 are illustrated using boxes having crosshatching in the drawings, while the SRAFs 102 are illustrated using shaded boxes.

As can be seen in FIGS. 1 and 3, features of the integrated circuit design 104 within the test portions 100, 130 have consistent size and spacing parameters in regions where the SRAFs 102 have inconsistent size and spacing parameters. Also, the size and spacing parameters of the SRAFs 102 include SRAF size, SRAF to integrated circuit feature size and spacing, and SRAF to SRAF spacing.

In item 186, such methods perform a single exposure and development process of the single test pattern to produce a single test photoresist. The SRAFs 102 influence and modify how features 104 of the integrated circuit design are printed in the single test photoresist. This is shown, for example, in the exposed and developed photoresists 120, 140 shown in FIGS. 2 and 4. More specifically, FIG. 2 illustrates a photoresist 120 exposed to the pattern shown in FIG. 1; and FIG. 4 illustrates the photoresist 140 exposed using the pattern shown in FIG. 3.

In item 188, such methods automatically or manually analyze the single test photoresist to determine which of the size and spacing parameters are unacceptable size and spacing parameters, and which of the size and spacing parameters are acceptable size and spacing parameters, based on differences between the single test photoresist and a model photoresist that the test portion of the integrated circuit design without the SRAFs would produce.

More specifically, the analysis of the single test photoresist in item 188 determines how different ones of the SRAFs affected the test portion of the integrated circuit design. The unacceptable size and spacing parameters cause the SRAFs to print within the single test photoresist, and the acceptable size and spacing parameters do not cause the SRAFs to print within the single test photoresist. This is shown, for example, in region 110 shown in FIGS. 1 and 2. As can be seen in area 110 in FIG. 2, portions of some of the SRAFs 102 are printed in the photoresist 120, while other SRAFs 102 are not printed in the photoresist 120, and such differences in printing occur because of the different sizes, shapes, and spacings of the SRAFs 102.

Note, that FIGS. 2 and 4 include the outlines of the SRAFs 102, and that such outlines are only included in the drawings in order to help the viewer see where the SRAFs 102 would be located within the photoresists 120, 140; however, such outlines are not actually printed in the photoresists 120, 140, and the only features that actually appear in the photoresists 120, 140 are the solid features.

In another example, as can be seen when comparing area 112 in FIGS. 1 and 2, no SRAFs 102 print in the photoresist 120 in area 112. To the contrary, in area 114, some portions of the SRAFs 102 print within the photoresist 120. As can be seen in FIG. 1, the SRAFs 102 in areas 112 and 114 are different because they have different lengths, different widths, they are spaced differently from one another and from integrated circuit features 104, and there are a different number of SRAFs 102 in areas 112 and 114. Note however, that the integrated circuit features 104 are consistently sized and spaced in both areas 112 and 114. The difference in size, spacing, number, etc., between the SRAFs 102 in areas 112 and 114 results in the SRAFs 102 in area 112 not being printed, but the SRAFs 102 in area 114 being printed.

As noted above, it is not desirable to have SRAFs print in the photoresist. Therefore, the analysis performed an item 188 classifies the sizing, spacing, and number of SRAFs appearing in the area 112 to be acceptable for an integrated circuit design having the size and shape of the integrated circuit design 104 appearing in area 112 because the SRAFs did not print. To the contrary, the sizing, spacing, and the number of SRAFs in area 114 is considered unacceptable for such sized, spaced, and shaped integrated circuit structures 104 for an integrated circuit design having the size and shape of the integrated circuit design 104 appearing in area 112 because the SRAFs did print.

The same is true for areas 132 and 134 in FIGS. 3 and 4, where in area 132 in FIGS. 3 and 4, no SRAFs 102 print in the photoresist 140. To the contrary, in area 134, some portions of the SRAFs 102 print within the photoresist 140, and such undesirable printing is shown as item 142 in FIG. 4. As can be seen in FIG. 4, the SRAFs 102 in areas 132 and 134 are different because they are spaced differently from one another and from the integrated circuit features 104. Note however, that the integrated circuit features 104 are consistently sized and spaced in both areas 132 and 134. The difference in spacing, etc., between the SRAFs 102 in areas 132 and 134 results in the SRAFs 102 in area 132 not being printed (SRAF sizing and spacing acceptable), but the SRAFs 102 in area 134 being printed, e.g., printed area 142 (SRAF sizing and spacing not acceptable).

Also, FIGS. 3 and 4 illustrate a SRAF 136 that has decreasing size (decreasing width) as it runs between two integrated circuit features 104 that are unchanging in size, spacing, etc. As can be seen in FIG. 4, item 140 represents the printing that occurs in the wider regions of SRAF 136, but does not occur in the more narrow regions of SRAF 136. This allows the analysis in item 188 to provide an indication of SRAF width that will result in printed features and that which will not (when evaluating situations of integrated circuit features 104 spaced as shown on either side of SRAF 136 in FIG. 3).

The indication of SRAF width that will result in printed features (for integrated circuit features 104 spaced as shown on either side of SRAF 136) can also be output graphically, by methods, devices, and systems herein, as shown in FIG. 5. More specifically, FIG. 4 includes gauges 150, 152, 154 along the length of SRAF 136, and such gauges are shown graphically in the output of FIG. 5. Note, that such gauges do not appear in the photoresist 140, but are only included in the drawings as reference lines. In addition, the output graph in FIG. 5 includes a linear print threshold line 158 (intersected by the gauges 150, 152, 154) and an aerial image line 156. Portions of the aerial image line 156 that are to the right of the print threshold line 158 will result in SRAFs printing; however, portions of the aerial image line 156 that are to the left of the print threshold line 158 will not result in SRAFs printing. The output graph shown in FIG. 5 allows the user to understand that the SRAF widths below gauge 154 will not result in SRAF printing.

The methods, devices, and systems herein can output the results of the analysis occurring in item 188 in FIG. 6 to the user in many different ways. One example is the graph shown in FIG. 5. Another example is an image of the photoresists 120, 140 shown in FIGS. 2 and 4, with the SRAFs shown as outline boxes (as FIGS. 2 and 4 do). Additionally, the analysis in item 188 in FIG. 6 can provide absolute or relative measures of acceptable and unacceptable SRAF shape, spacing, and size. Therefore, the size, shape, and spacing thresholds for SRAFs can be output relative to the size, shape, and spacing of other features, or can be output in absolute measures irrespective of any surrounding structures.

Later, in item 190, such methods can add SRAFs that have the acceptable size and spacing parameters to the integrated circuit design to produce a production photoresist to increase focus sharpness of all integrated circuit features in the test portion and the remaining portion. The production photoresist is used to actually manufacture the integrated circuit devices, and is therefore different from the single test photoresist, and the SRAFs in the production photoresist are only those SRAFs that have the acceptable size and spacing parameters. The processing in item 190 can be automatic or manual. Therefore, the user can manually space, size, etc., the SRAF on the existing integrated circuit design, or the processor can automatically only add SRAFs that have acceptable spacing, sizes, and shapes considering the surrounding structures. The user can then be provided an option to alter such SRAFs that have been automatically added to the integrated circuit design.

Therefore, rather than having to utilize many different SRAF test masks (each of which includes only one sized and spaced type of SRAF) the devices, systems, and methods herein utilize many different sized, spaced, and shaped SRAFs in a single test mask. This allows a single exposure and development process to produce results for many differently spaced, sized, and shaped SRAFs.

Various items herein include a mask that provides a SRAF test case (examples of which are shown in FIGS. 1 and 3) that includes integrated circuit design features 104 within a test portion 100, 130 of an integrated circuit design. The integrated circuit design also includes a remaining portion in addition to the test portion 100, 130 shown in FIGS. 1 and 3. Further, the SRAF test case includes sub-resolution assist features (SRAFs 102) having different size and spacing parameters within the test portion 100, 130 of the integrated circuit design.

The SRAFs 102 are positioned between features 104 of the integrated circuit design, and the SRAFs 102 influence and modify how features 104 of the integrated circuit design are printed in the single test photoresist (as shown in FIGS. 2 and 4). Features 104 of the integrated circuit design within the test portion have consistent size and spacing parameters in regions where the SRAFs 102 have inconsistent size and spacing parameters. Also, the size and spacing parameters of the SRAFs 102 include SRAF size, SRAF to integrated circuit feature size and spacing, and SRAF to SRAF spacing.

A single exposure and development process of the single test pattern produces a single test photoresist (as shown in FIGS. 2 and 4). Analysis of the single test photoresist determines which of the size and spacing parameters are unacceptable size and spacing parameters, and which of the size and spacing parameters are acceptable size and spacing parameters based on differences between the single test photoresist and a model photoresist that the test portion of the integrated circuit design without the SRAFs 102 would produce (e.g., a comparison of FIGS. 1 and 2, or of FIGS. 3 and 4).

The analysis of the single test photoresist determines how different ones of the SRAFs 102 affected the test portion of the integrated circuit design. The unacceptable size and spacing parameters cause the SRAFs 102 to print within the single test photoresist, and the acceptable size and spacing parameters do not cause the SRAFs 102 to print within the single test photoresist.

Figure 7:
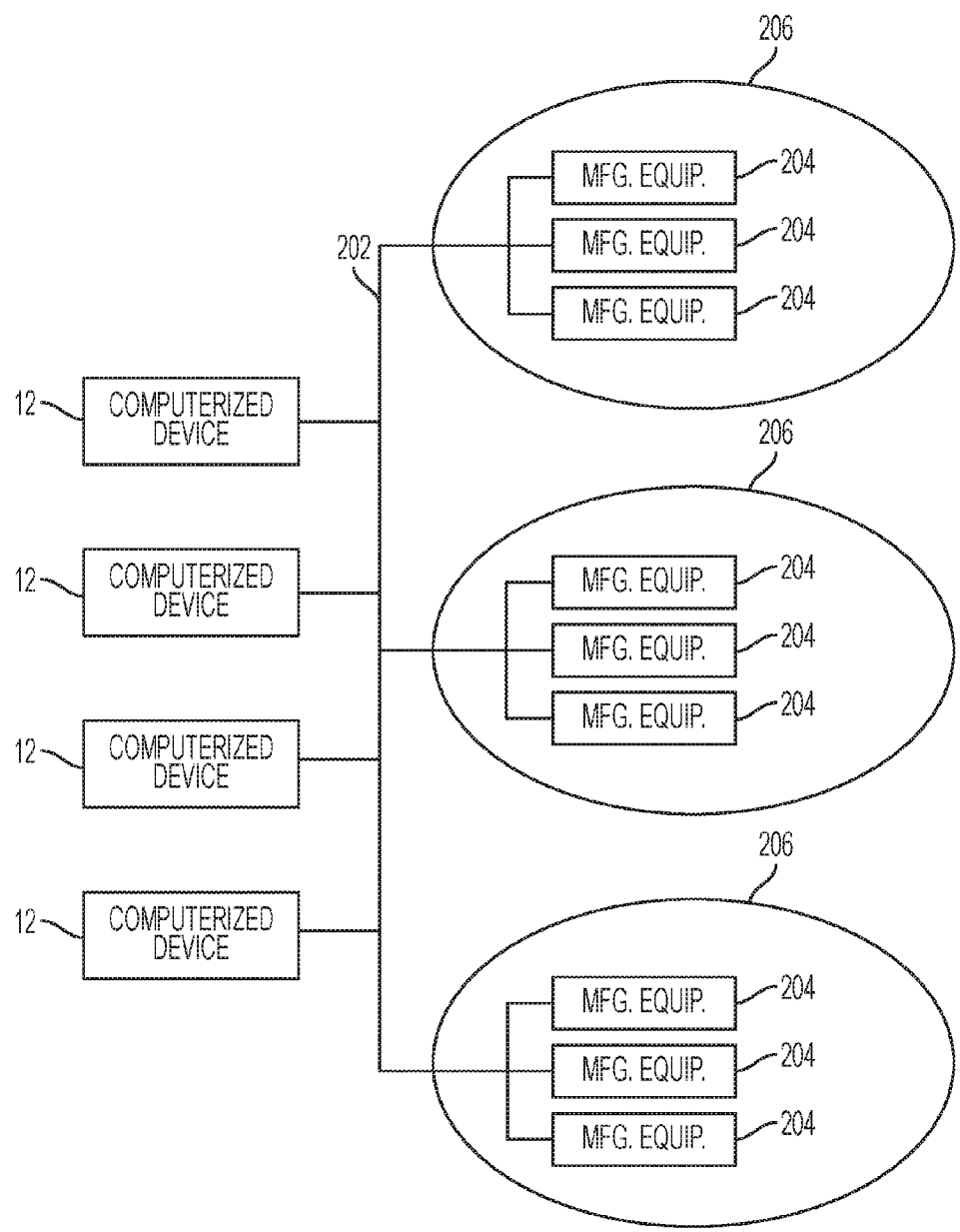
FIG. 7 is a schematic diagram illustrating an exemplary system herein.

FIG. 7 illustrates various systems herein. Such systems can include various computerized devices 12 connected to various manufacturing equipment 204 through a computerized network 202. The computerized devices 12 can include servers, mainframes, personal computers, laptops, personal digital assistants (PDA's), portable electronic devices (such as smart phones, tablets, etc.), etc. The network 202 can include any form of local or wide area network, including wired and wireless networks. The manufacturing equipment 204 may or may not be located at many different locations 206. The manufacturing equipment 204 can perform any of the manufacturing processing discussed herein, including exposing and developing photoresists. The details of such devices are well-known to those ordinarily skilled in the art, and such details are intentionally omitted herefrom in order to focus the reader upon the salient features of the methods, systems, and devices herein.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Figure 8:
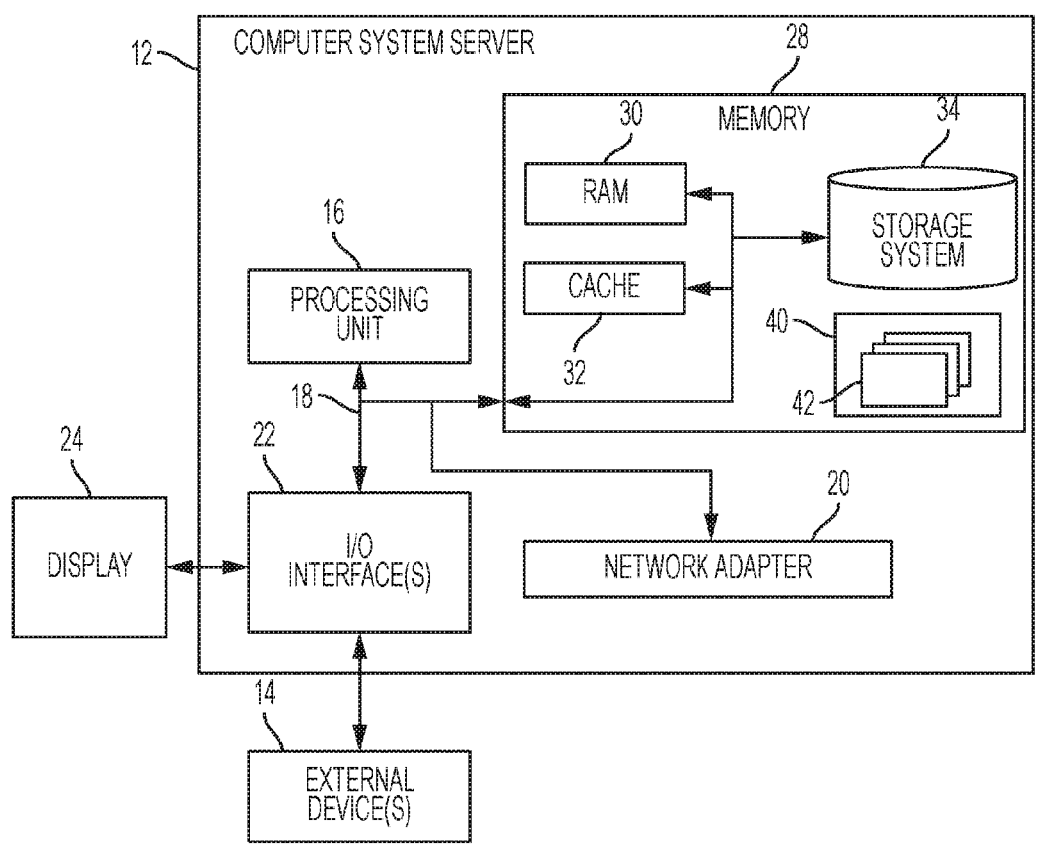
FIG. 8 is a schematic diagram illustrating an exemplary computerized device herein.

FIG. 8 illustrates that the components of computerized device 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus. Computerized device 12 typically includes a variety of computer system readable media. Such media may be any available media that is accessible by computerized device 12, and it includes both volatile and non-volatile media, removable and non-removable media.

System memory 28 can include computer system readable media in the form of volatile memory, such as random access memory (RAM) 30 and/or cache memory 32. Computerized device 12 may further include other removable/non-removable, volatile/non-volatile computer system storage media. By way of example only, storage system 34 can be provided for reading from and writing to a non-removable, non-volatile magnetic media (not shown and typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computerized device 12 may also communicate with one or more external devices 14 such as a keyboard, a pointing device, a display 24, etc.; one or more other devices that enable a user to interact with computerized device 12; and/or any devices (e.g., network card, modem, etc.) that enable computerized device 12 to communicate with one or more other computing devices. Such communication can occur via Input/Output (I/O) interfaces 22. Still yet, computerized device 12 can communicate with one or more networks such as a local area network (LAN), a general wide area network (WAN), and/or a public network (e.g., the Internet) via network adapter 20. As depicted, network adapter 20 communicates with the other components of computerized device 12 via bus 18. It should be understood that although not shown, other hardware and/or software components could be used in conjunction with computerized device 12. Examples include, but are not limited to, microcodes, device drivers, redundant processing units, external disk drive arrays, RAID systems, tape drives, and data archival storage systems, etc.

Therefore, as shown in FIGS. 7 and 8, various systems herein include (among other components) a processor 16 that receives an integrated circuit design, divides the integrated circuit design into a test portion and a remaining portion, and adds sub-resolution assist features (SRAFs) having different size and spacing parameters to the test portion of the integrated circuit design to generate a single test pattern.

The SRAFs are positioned between features of the integrated circuit design, and the SRAFs influence and modify how features of the integrated circuit design are printed in the single test photoresist. Features of the integrated circuit design within the test portion have consistent size and spacing parameters in regions where the SRAFs have inconsistent size and spacing parameters. Also, the size and spacing parameters of the SRAFs include SRAF size, SRAF to integrated circuit feature size and spacing, and SRAF to SRAF spacing.

Such systems also include exposure and development equipment 204 operatively (meaning directly or indirectly) connected to the processor 16. The exposure and development equipment 204 perform a single exposure and development process of the single test pattern to produce a single test photoresist. The processor 16 analyzes the single test photoresist to determine which of the size and spacing parameters are unacceptable size and spacing parameters, and which of the size and spacing parameters are acceptable size and spacing parameters based on differences between the single test photoresist and a model photoresist that the test portion of the integrated circuit design without the SRAFs would produce. The processor 16 adds SRAFs having the acceptable size and spacing parameters to the remaining portion of the integrated circuit design.

More specifically, the processor 16 analyzes the single test photoresist by determining how different ones of the SRAFs affected the test portion of the integrated circuit design. The unacceptable size and spacing parameters cause the SRAFs to print within the single test photoresist, and the acceptable size and spacing parameters do not cause the SRAFs to print within the single test photoresist.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   receiving an integrated circuit design;
   adding sub-resolution assist features (SRAFs) having different size and spacing parameters to the integrated circuit design to generate a single test pattern, wherein at least one of the SRAFs has a decreasing width as it runs between two features of the integrated circuit design that are unchanging in size and spacing;
   performing a single exposure and development process of the single test pattern to produce a single test photoresist;
   analyzing the single test photoresist to determine which of the size and spacing parameters are unacceptable size and spacing parameters, and which of the size and spacing parameters are acceptable size and spacing parameters based on differences between the single test photoresist and a model photoresist that the integrated circuit design without the SRAFs would produce; and
   adding SRAFs having the acceptable size and spacing parameters to the integrated circuit design to produce a production photoresist.

2. The method according to claim 1, the analyzing the single test photoresist comprises determining how different ones of the SRAFs affected the integrated circuit design.

3. The method according to claim 1, the unacceptable size and spacing parameters cause the SRAFs to print within the single test photoresist, and the acceptable size and spacing parameters do not cause the SRAFs to print within the single test photoresist.

4. The method according to claim 1, features of the integrated circuit design have consistent size and spacing parameters in regions where the SRAFs have inconsistent size and spacing parameters.

5. The method according to claim 1, the size and spacing parameters of the SRAFs include SRAF size, SRAF to integrated circuit feature size and spacing, and SRAF to SRAF spacing.

6. The method according to claim 1, the SRAFs influence and modify how features of the integrated circuit design are printed in the single test photoresist.

7. The method according to claim 1, the SRAFs are positioned between features of the integrated circuit design.

8. A method comprising:
   receiving an integrated circuit design;
   dividing the integrated circuit design into a test portion and a remaining portion;
   adding sub-resolution assist features (SRAFs) having different size and spacing parameters to the test portion of the integrated circuit design to generate a single test pattern, wherein at least one of the SRAFs has a decreasing width as it runs between two features of the integrated circuit design that are unchanging in size and spacing;
   performing a single exposure and development process of the single test pattern to produce a single test photoresist;
   analyzing the single test photoresist to determine which of the size and spacing parameters are unacceptable size and spacing parameters, and which of the size and spacing parameters are acceptable size and spacing parameters based on differences between the single test photoresist and a model photoresist that the test portion of the integrated circuit design without the SRAFs would produce; and
   adding SRAFs having the acceptable size and spacing parameters to the integrated circuit design to produce a production photoresist.

9. The method according to claim 8, the analyzing the single test photoresist comprises determining how different ones of the SRAFs affected the test portion of the integrated circuit design.

10. The method according to claim 8, the unacceptable size and spacing parameters cause the SRAFs to print within the single test photoresist, and the acceptable size and spacing parameters do not cause the SRAFs to print within the single test photoresist.

11. The method according to claim 8, features of the integrated circuit design within the test portion have consistent size and spacing parameters in regions where the SRAFs have inconsistent size and spacing parameters.

12. The method according to claim 8, the size and spacing parameters of the SRAFs include SRAF size, SRAF to integrated circuit feature size and spacing, and SRAF to SRAF spacing.

13. The method according to claim 8, the SRAFs influence and modify how features of the integrated circuit design are printed in the single test photoresist.

14. The method according to claim 8, the SRAFs are positioned between features of the integrated circuit design.

15. A system comprising:
   a processor receiving an integrated circuit design, dividing the integrated circuit design into a test portion and a remaining portion, and adding sub-resolution assist features (SRAFs) having different size and spacing parameters to the test portion of the integrated circuit design to generate a single test pattern, wherein at least one of the SRAFs has a decreasing width as it runs between two features of the integrated circuit design that are unchanging in size and spacing; and
   exposure and development equipment operatively connected to the processor, the exposure and development equipment performing a single exposure and development process of the single test pattern to produce a single test photoresist,
   the processor analyzes the single test photoresist to determine which of the size and spacing parameters are unacceptable size and spacing parameters, and which of the size and spacing parameters are acceptable size and spacing parameters based on differences between the single test photoresist and a model photoresist that the test portion of the integrated circuit design without the SRAFs would produce, and the processor adds SRAFs having the acceptable size and spacing parameters to the integrated circuit design to produce a production photoresist.

16. The system according to claim 15, the processor analyzes the single test photoresist by determining how different ones of the SRAFs affected the test portion of the integrated circuit design.

17. The system according to claim 15, the unacceptable size and spacing parameters cause the SRAFs to print within the single test photoresist, and the acceptable size and spacing parameters do not cause the SRAFs to print within the single test photoresist.

18. The system according to claim 15, features of the integrated circuit design within the test portion have consistent size and spacing parameters in regions where the SRAFs have inconsistent size and spacing parameters.

19. The system according to claim 15, the size and spacing parameters of the SRAFs include SRAF size, SRAF to integrated circuit feature size and spacing, and SRAF to SRAF spacing.

20. The system according to claim 15, the SRAFs influence and modify how features of the integrated circuit design are printed in the single test photoresist.

* * * * *